United States Patent
Takeuchi et al.

(10) Patent No.: US 8,329,559 B2
(45) Date of Patent: Dec. 11, 2012

(54) DAMASCENE PROCESS FOR USE IN FABRICATING SEMICONDUCTOR STRUCTURES HAVING MICRO/NANO GAPS

(75) Inventors: Hideki Takeuchi, Austin, TX (US);
Emmanuel P. Quevy, El Cerrito, CA (US); Tsu-Jae King, Fremont, CA (US);
Roger T. Howe, Los Gatos, CA (US)

(73) Assignee: The Regents of the University of California, Oakland, CA (US)

( * ) Notice: Subject to any disclaimer, the term of this patent is extended or adjusted under 35 U.S.C. 154(b) by 1636 days.

(21) Appl. No.: 11/737,545

(22) Filed: Apr. 19, 2007

(65) Prior Publication Data

US 2012/0171798 A1    Jul. 5, 2012

Related U.S. Application Data

(62) Division of application No. 11/121,690, filed on May 3, 2005, now Pat. No. 7,256,107.

(60) Provisional application No. 60/568,404, filed on May 4, 2004.

(51) Int. Cl.
*H01L 21/46* (2006.01)
*H01L 21/78* (2006.01)
*H01L 21/301* (2006.01)

(52) U.S. Cl. ........ 438/460; 438/680; 438/700; 438/692; 257/E21.17; 257/E21.127; 257/E21.229; 257/E21.237; 257/E21.304; 257/E21.278

(58) Field of Classification Search .................. 438/460, 438/113, 197, 199, 311, 475, 933, 680, 692, 438/706, 723, 752, 753; 257/E21.17, E21.127, 257/E21.229, E21.237, E21.278, E21.304
See application file for complete search history.

(56) References Cited

U.S. PATENT DOCUMENTS

| | | | | |
|---|---|---|---|---|
| 5,976,994 A * | 11/1999 | Nguyen et al. | ................ | 438/795 |
| 6,027,630 A * | 2/2000 | Cohen | ........................... | 205/135 |
| 6,391,674 B2 * | 5/2002 | Ziegler | ............................ | 438/52 |
| 7,256,107 B2 * | 8/2007 | Takeuchi et al. | .............. | 438/460 |

\* cited by examiner

*Primary Examiner* — David Nhu
(74) *Attorney, Agent, or Firm* — John P. O'Banion

(57) ABSTRACT

In fabricating a microelectromechanical structure (MEMS), a method of forming a narrow gap in the MEMS includes a) depositing a layer of sacrificial material on the surface of a supporting substrate, b) photoresist masking and at least partially etching the sacrificial material to form at least one blade of sacrificial material, c) depositing a structural layer over the sacrificial layer, and d) removing the sacrificial layer including the blade of the sacrificial material with a narrow gap remaining in the structural layer where the blade of sacrificial material was removed.

27 Claims, 10 Drawing Sheets

DAMASCENE PROCESS FOR USE IN FABRICATING SEMICONDUCTOR STRUCTURES HAVING MICRO/NANO GAPS

CROSS-REFERENCE TO RELATED APPLICATIONS

This application is a division of U.S. patent application Ser. No. 11/121,690, filed on May 3, 2005, now U.S. Pat. No. 7,256,107, incorporated herein by reference in its entirety, which claims priority from U.S. Provisional Patent Application No. 60/568,404, filed May 4, 2004, incorporated herein by reference in its entirety.

STATEMENT REGARDING FEDERALLY SPONSORED RESEARCH OR DEVELOPMENT

This invention was made with Government support under Grant No. N66001-01-1-8967, awarded by the DARPA/NMASP. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention relates generally to the fabrication of semiconductor microelectromechanical structures (MEMS) and more particularly the invention relates to the fabrication of structures such as mechanical resonators which require narrow gaps between a resonator body and drive and sense electrodes.

2. Description of Related Art

Micromachined resonators are promising as on-chip replacements for discrete filters and oscillators which are presently implemented using off-chip quartz and surface-acoustic-wave (SAW) devices in wireless communication systems. The monolithic integration of control, amplification and signal processing electronics with radio frequency microelectromechanical devices (RF MEMS) also reduces parasitic capacitances and inductances as well as overall system power consumption. Recent progress toward a low-thermal-budget polycrystalline silicon-germanium (poly-SiGe) MEMS technology promises to make possible the modular co-fabrication of high performance surface-micromachined structures on top of completed CMOS wafers. However, a detailed process integration scheme for poly-SiGe resonator fabrication—particularly one that provides ultra-narrow lateral gaps between the resonator and drive/sense electrodes—is needed.

There are several process requirements for post-CMOS integration of RF resonators. First, the MEMS fabrication thermal process budget must be carefully designed in order to retain the performance and reliability of the CMOS electronics. Interconnect reliability, rather than transistor performance, limits the post processing temperature, which should not exceed 450° C. High quality poly-SiGe structural layers with Ge content greater than ~60% can be deposited by conventional low-pressure chemical vapor deposition without exceeding this temperature limit. Second, the metallization stack of the underlying electronics must be protected from chemical attack during the microstructure release etch. The use of Ge rather than $SiO_2$ as the sacrificial material is advantageous because it can be rapidly etched in a heated H2O2 solution which does not attack oxide, metal, poly-Si, or poly-SiGe with a Ge content less than ~70%. Third, extremely small (sub-100 nm) electrode gaps are needed in order to achieve low motional resistances, hence low insertion losses. For the definition of nanoscale lateral gaps, a sidewall sacrificial oxide spacer process has already been developed for poly-Si MEMS technology. In this process, the poly-Si electrode layer (which is deposited after the sacrificial spacers are formed) must be etched with high selectivity to the sacrificial oxide, in order to clear it completely along the sidewalls of the structural poly-Si layer in the areas where the electrode layer must be removed. Because Ge etches more quickly (by a factor of ~3) than poly SiGe or poly-Si in a standard Cl2/HBr dry-etch chemistry, the sidewall spacer process cannot be used if Ge is employed as the sacrificial material, however.

BRIEF SUMMARY OF THE INVENTION

The invention utilizes a damascene process to define gaps in semiconductor MEMS structure such as micromachined resonators which have gaps separating a resonator body and drive and sense electrodes juxtaposed with but spaced from the resonator body.

More particularly, a thin blade is formed in a sacrificial material with the blade functioning to define a gap between two material bodies formed to abut the blade. After forming the two bodies, the blade is selectively removed such as by a preferential etch so that a gap remains between and separating the two bodies.

The invention is particularly applicable in fabricating a bulk-longitudinal resonator and will be described with reference to the fabrication of such a structure. However, this description of the invention is illustrative of the invention and not limiting the invention.

The invention and objects and features thereof will be more readily apparent from the following detailed description and appended claims when taken with the drawings.

BRIEF DESCRIPTION OF THE SEVERAL VIEWS OF THE DRAWING(S)

DETAILED DESCRIPTION OF THE INVENTION

Figure 6:
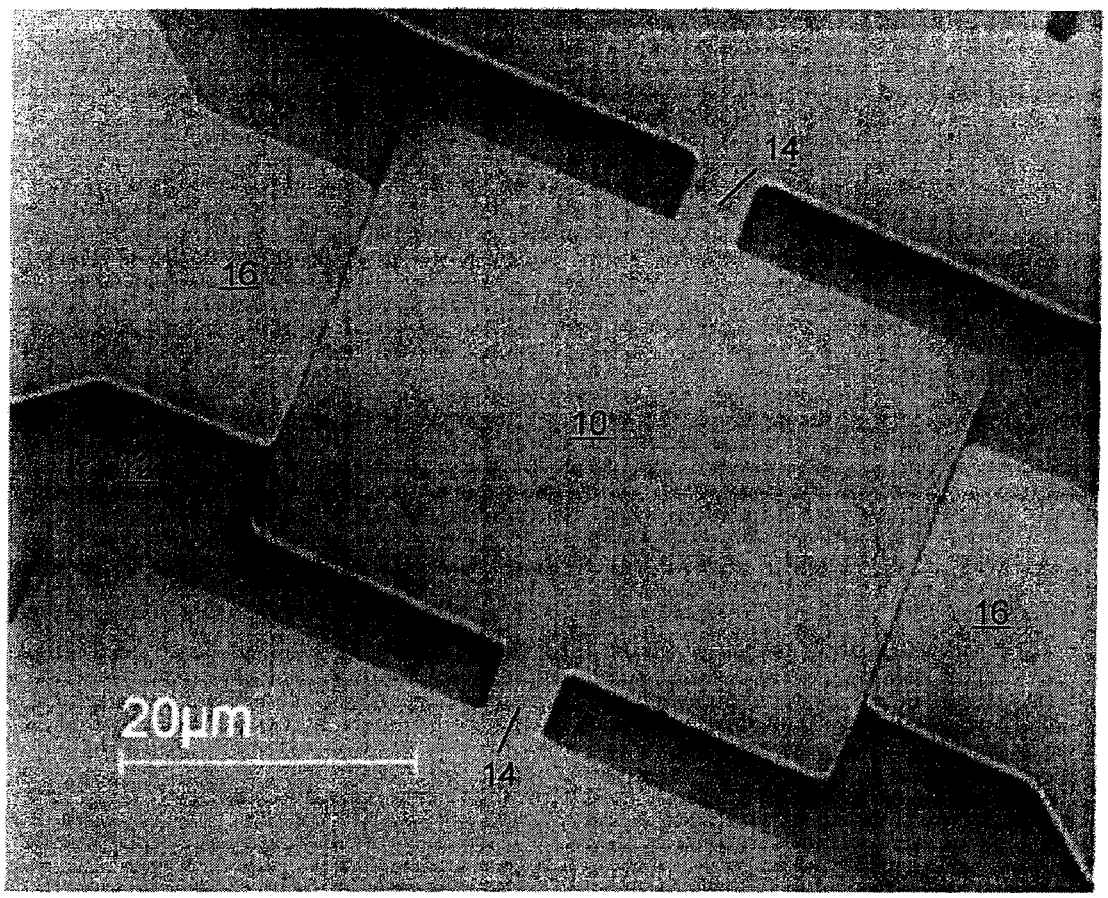
FIG. 6 is a SEM picture of bulk-longitudinal resonator.

The invention will be described with reference to process steps useful in fabricating a bulk-longitudinal resonator structure, such as shown in FIG. 6. Typically a bulk resonator body of suitable semiconductor material such as SiGe is fabricated on a substrate with anchors on opposing sides of the resonator body supporting the body above the substrate. Alternatively, an anchor centrally disposed under the body can support the body above the substrate. Drive and sense electrodes are juxtaposed with resonator body and are spaced therefrom by gaps on the order of 100 nanometers.

FIG. 1 illustrates the fabrication process; scanning electron microscopy (SEM) pictures at various steps are presented in FIG. 2. A Si wafer covered with 1-μm CVD-$SiO_2$ was used as the starting substrate. For simplicity, a two-mask process was used. First, a 2-μm-thick in-situ boron-doped poly-Ge sacrificial film was deposited by LPCVD (350° C., 2hr deposition) and patterned using i-line lithography. The structures include 0.5 μm minimum width lines to define the transducer's lateral gaps (FIG. 1a). Photoresist ashing in $O_2$ plasma was used to reduce the minimum line width to 50 nm (FIG. 1b and FIG. 2a). The photoresist pattern was then transferred to the Ge layer using a $HBr/Cl_2$ chemistry in a transformer-coupled plasma (TCP) etcher. FIG. 2b shows SEM images of a high-aspect-ratio (I 0~20) Ge blade. Note that sidewall taper in the etched Ge structures, due mainly to a tapered photoresist profile, must be minimized for peak resonator performance. (Sidewall taper is undesirable for the aforementioned sidewall sacrificial oxide spacer process as well.) To avoid any potential adhesion issue for the narrow Ge-blades on $SiO_2$, the Ge was not etched all the way down to the underlying $SiO_2$; rather, a second mask was used to define anchoring contacts to the $SiO_2$ (FIG. 1c). Next, a 2.2 μm-thick in-situ boron-doped poly-$Si_{0.35}Ge_{0.65}$ structural layer was deposited by LPCVD (425° C., 400 mtorr, $SiH_4/GeH_4/B_2H_6$[10% in $H_2$]=100/60/60 sccm, 4 hr 40 min. deposition) as shown in FIG. 1d and 2c. This deposition step accounts for the majority of the total thermal process budget. FIG. 2d shows that the poly-$Si_{0.35}Ge_{0.65}$ is deposited conformally over the Ge blade. After chemical mechanical polishing (CMP) of the poly-$Si_{0.35}Ge_{0.65}$ layer (FIG. 1e), the sacrificial poly-Ge layer was removed in $H_2O_2$ at 90° C. (FIG. 1f). FIG. 2e shows an SEM image of a fabricated Double-Ended Tuning Fork (DETF) resonator. FIG. 2f shows a cross-sectional SEM image of the nanoscale gap. Due to high compressive stress and strain gradient in the poly-$Si_{0.35}Ge_{0.65}$ film, the gap is reduced to almost zero and the resonator is vertically displaced from the electrodes by ~100 nm, respectively.

This new process provides significant advantages for manufacturing. First, a single deposited layer is used to form the resonator structure and drive/sense electrodes, so that there is no need for a highly selective etch process in order to avoid the formation of unwanted "stringers" along the resonator sidewalls. Because the number of film deposition steps is reduced, the thermal process budget is substantially reduced. Second, nanoscale lateral gaps are achieved by lithographically patterning ultra narrow lines rather than spaces. Line patterning technology for ~100 nm features is well established, as 50 nm physical gate-length transistors are now used in products at the 90 nm CMOS technology node. This is because the well-controlled formation of ultra-narrow line widths is feasible using photoresist ashing or hard-mask trimming techniques. Also, because of the unique etching characteristics of Ge, the width of a Ge blade after it is formed by dry etching can be further reduced in a controllable manner, in hot (90° C.) deionized water. Finally, the unconstrained placement of lateral gaps is an additional advantage of this method as compared to the sidewall spacer process.

Figure 1A:
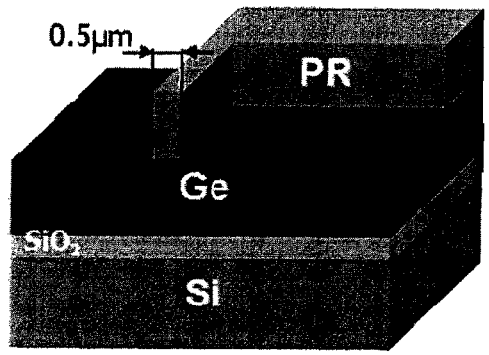
FIG. 1a-1f are outlines of the 2-mask Germanium Blade Damascene Process which provides ultra-narrow gaps.
Figure 1B:
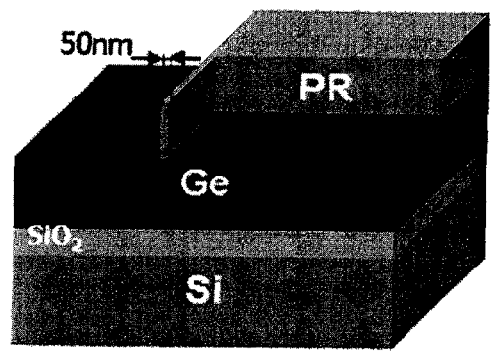
Figure 1C:
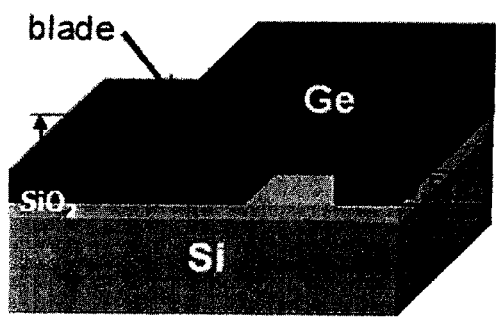
Figure 1D:
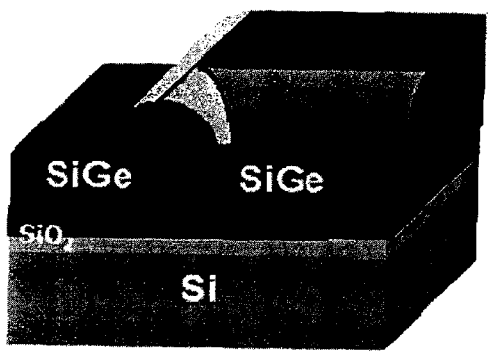
Figure 1E:
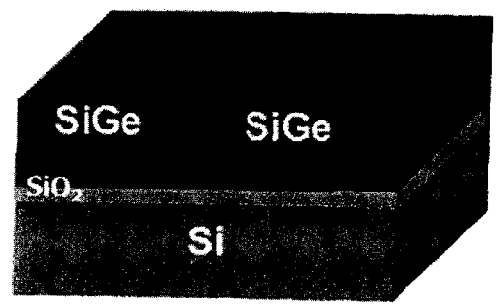
Figure 1F:
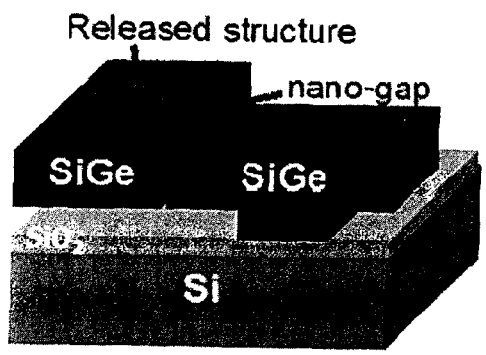
Figure 2A:
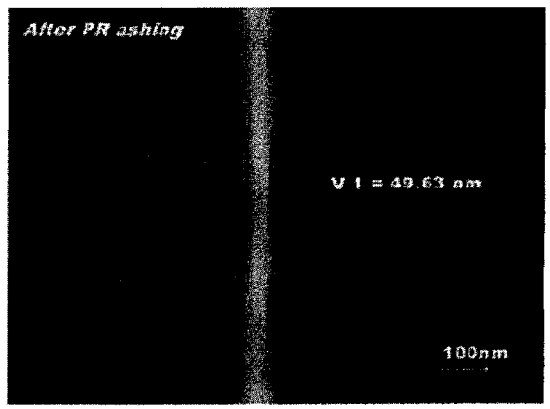
FIGS. 2a-2f are SEM pictures corresponding to various steps depicted in FIG. 1 in the case of a double-ended tuning fork (DETF): (a) 50 nm line definition by lithography and photoresist ashing; (b) High-aspect-ratio Ge blade; top view and (d) cross-section after SiGe structural layer deposition; (e) Released DETF top view and (f) cross-section.
Figure 2B:
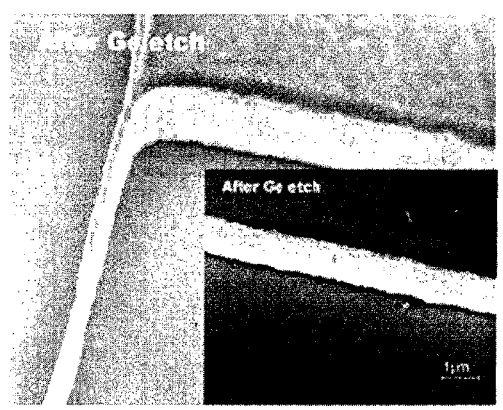
Figure 2C:
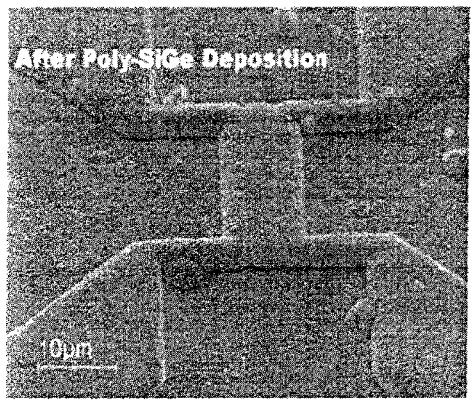
Figure 2D:
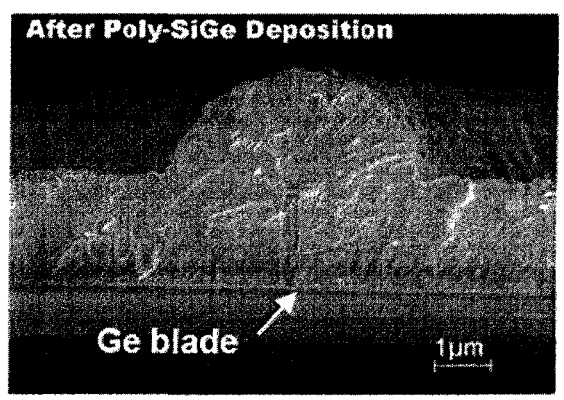
Figure 2E:
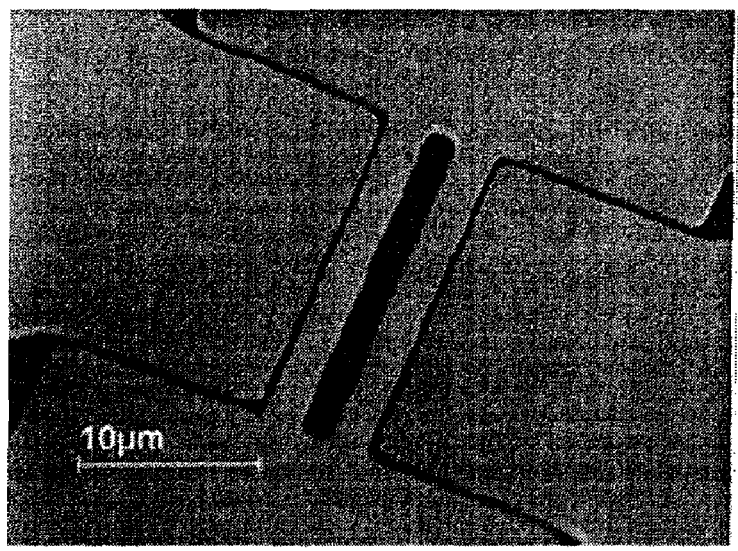
Figure 2F:
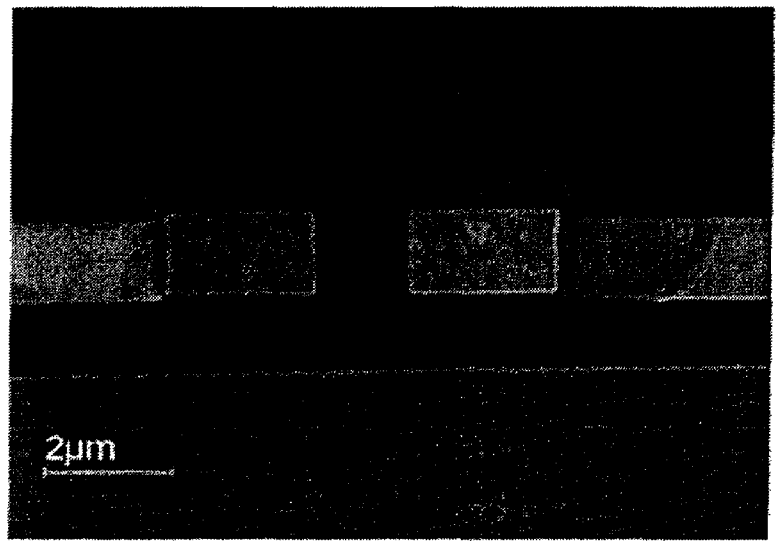
Figure 3A:
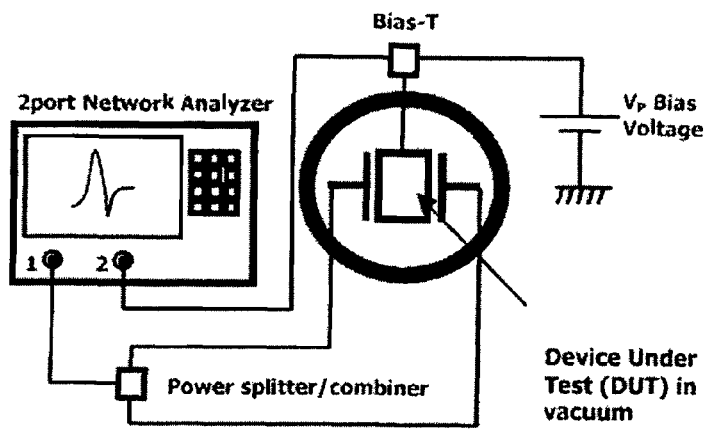
FIGS. 3a-3c are (a) Experimental set-up for Transmission Measurement with Differential Drive Configuration (b) and Differential Sense Configuration (c).
Figure 3B:
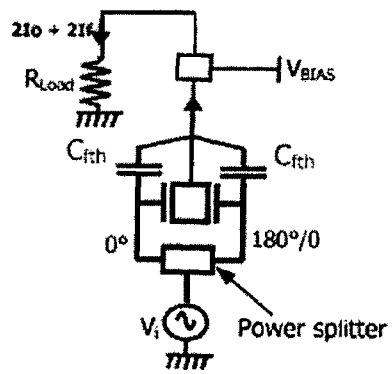
Figure 3C:
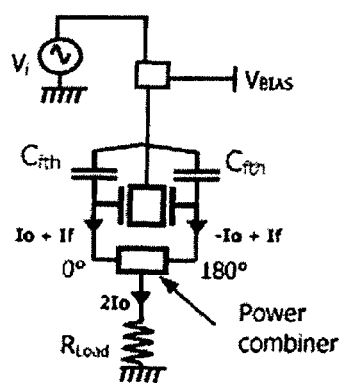

Devices fabricated using the 2-mask damascene Ge-blade process were characterized using various methods:

2-port measurement method:

The main problem encountered in testing of MEMS resonators is the feed-through capacitance. Indeed, using direct 2-port measurement of the 24 MHz resonator in FIG. 2e, the peak height achievable was only 0.5 dB. To address this problem, we used a differential drive/sense scheme as illustrated in FIGS. 3a-3c, the proof mass is used either as a drive or sense element, allowing better efficiency but higher direct feed-through via capacitive transduction. The use of a power combiner/splitter adds flexibility, allowing actuation of both symmetric/asymmetric modes, and providing feed-through cancellation for the asymmetric differential mode in particular.

Figure 4A:
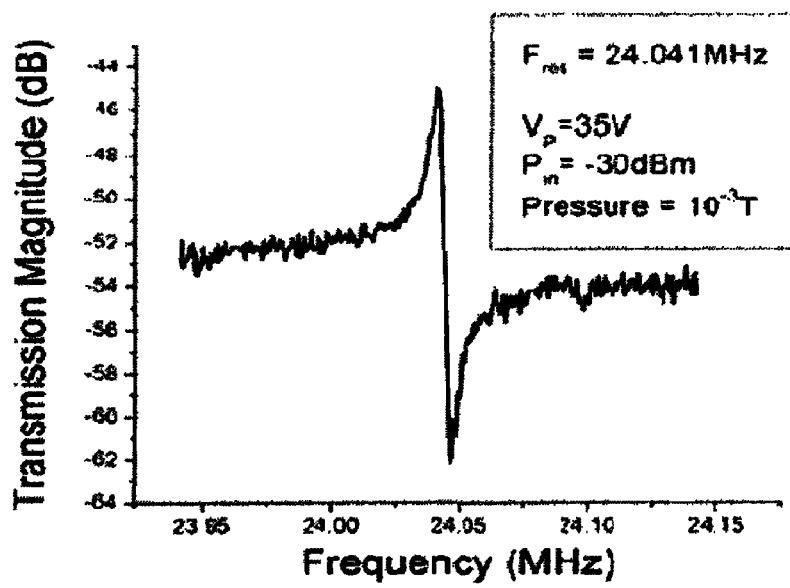
FIGS. 4a, 4b illustrate Transmission Magnitude of the Double-Ended Tuning Fork shown in FIG. 2e, in the case of Differential Sense Configuration for the asymmetric mode (a), and RF/LO technique for the symmetric mode (b).

Using the differential drive/sense scheme, the transmission characteristic of the same DETF is shown in FIG. 4a, exhibiting a resonance peak increased to 8 dB at 24.05 MHz, and a quality factor of 4800. Based on frequency pulling extraction, the effective gap was determined to be 295 nm, which accounts for the low transduction efficiency. This gap broadening can be attributed primarily to insufficient etch selectivity (of Ge vs. poly-$Si_{0.35}Ge_{0.65}$) during the long release etch in $H_2O_2$, which can be remedied by using a structural layer with Ge content below 65%. Poor critical dimension (CD) control on the blade definition mask may also have contributed to the gap broadening.

Figure 5:
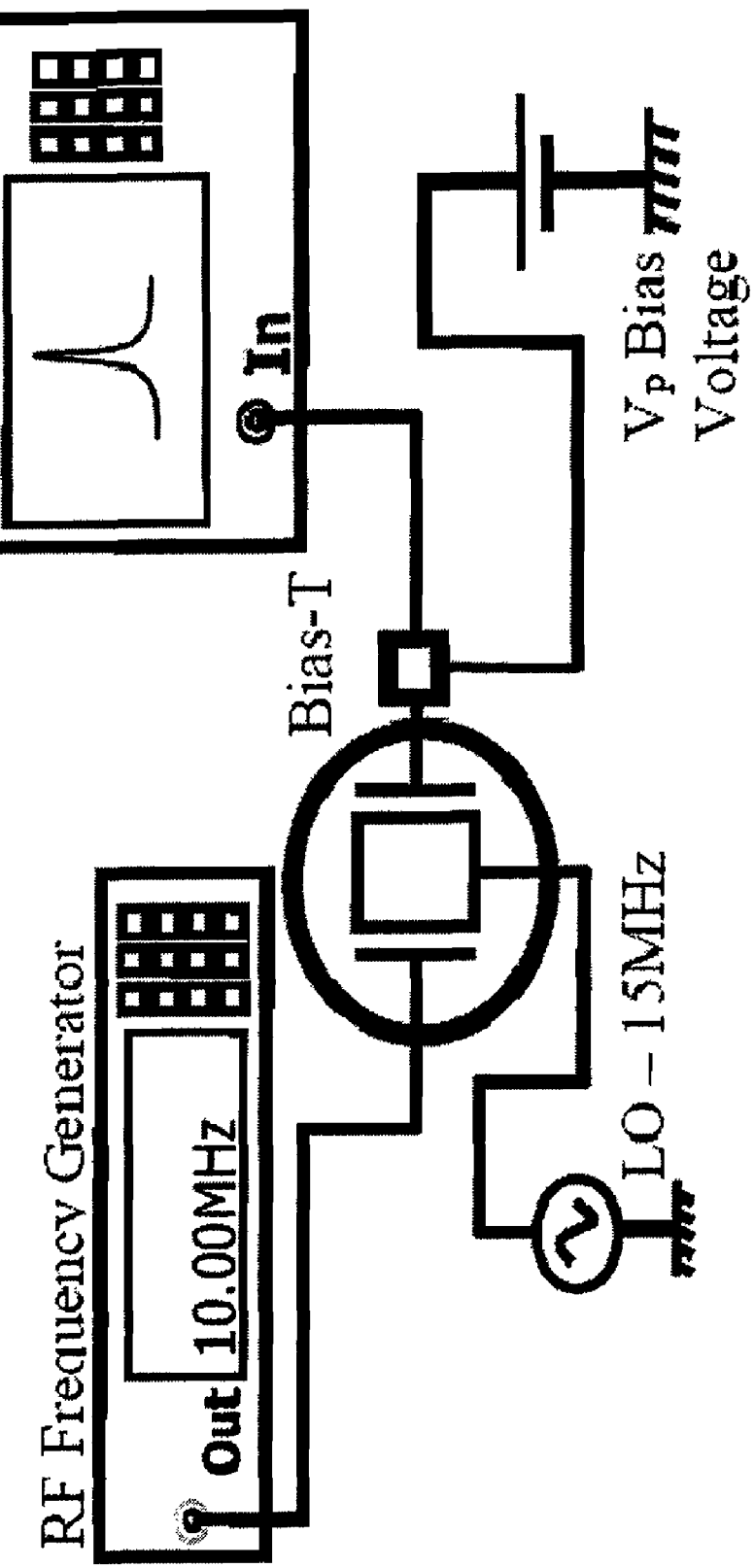
FIG. 5 is an experimental set-up for RF/LO measurement technique.

RF/LO technique:

The RF/LO technique shown in FIG. 5 was used to perform characterization of fabricated device at higher frequencies. Indeed, this technique takes advantage of the capacitive nonlinearity of the transducer to perform mixing and thus further minimize the influence of any parasitic feed-through in the resonance band.

Figure 4B:
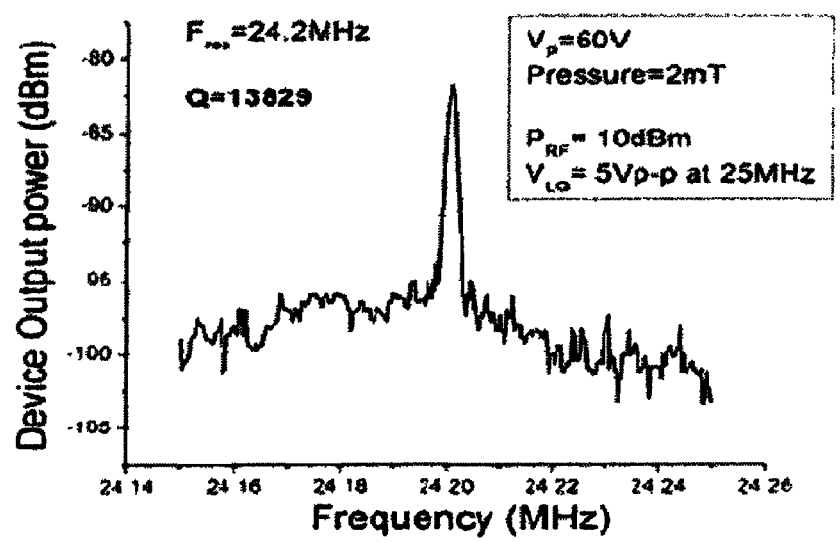

In the case of the 24 MHz tuning fork, this technique was used to characterize the symmetric mode and to extract an expectedly higher Q of 13,800 (FIG. 4b).

Figure 7A:
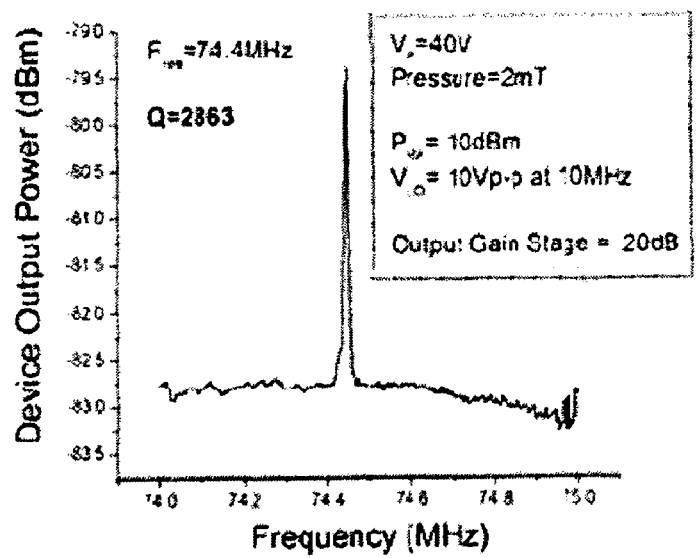
FIG. 7a, 7b illustrate device output power of the Bulk Longitudinal Resonator shown in FIG. 6 using the RF/LO measurement technique: (a) Fundamental Mode (b) Third Harmonic.
Figure 7B:
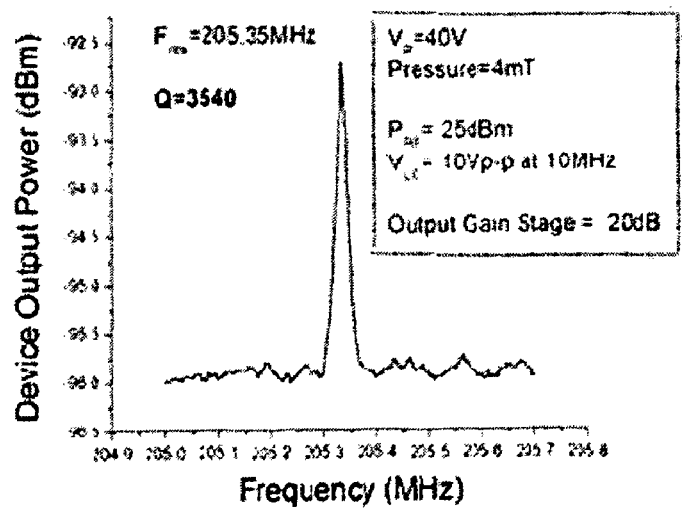

A 40 μm-long and 32 μm-wide bulk-longitudinal resonator (FIG. 6) was also characterized using this technique. A 74.4 MHz resonance was observed for the fundamental mode, while the third harmonic mode was visible at 205 MHz, as shown in FIGS. 7a and 7b. The quality factors were measured to be 2,900 and 3,500 respectively.

Figure 8:
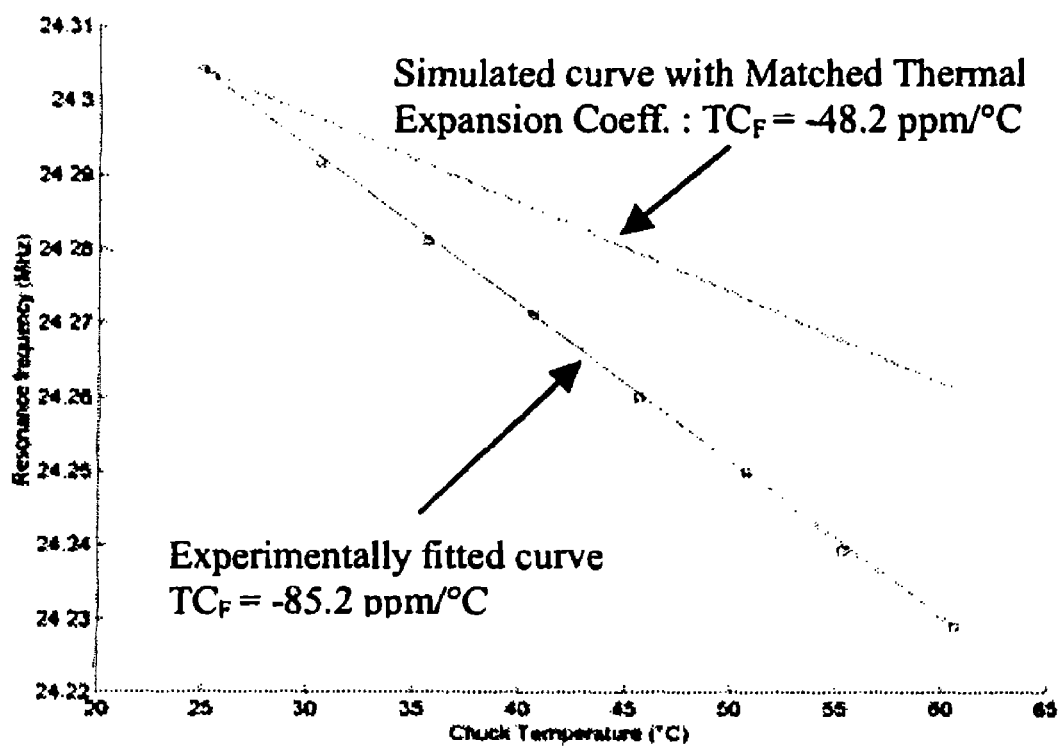
FIG. 8 is a plot of measured and simulated frequency dependence versus temperature for a DEFT.

Temperature Drift:

FIG. 8 presents the temperature dependence of the DETF, which exhibits TCF=−85 ppm/° C., greatly influenced by the compressive stress due to thermal-expansion mismatch between the SiGe structure and Si substrate. Using a simple model, the corresponding TCF for SiGe was extracted to be −104 ppm/° C. On the same plot, a simulated curve shows the benefit of matching the thermal expansion coefficients of the substrate and the structure, resulting in a lower TCF of −48 ppm/° C. Although these values are higher than for poly-Si, it is possible to take advantage of such a mismatch to integrate efficient temperature-sensing structures for compensation purpose.

A Ge-Blade Damascene Process has been described and successfully applied to fabricate a high-frequency DETF resonator. Due to its low thermal budget, HF-free release process, and highly-planar surface topography, this new process is particularly applicable for post-CMOS integration of nano-mechanical resonators applicable for RF communication systems.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of forming a micromechanical structure (MEMS), comprising:
   forming a sacrificial material on a substrate;
   forming a masking layer on said sacrificial material;
   forming a masking layer blade from said masking layer, said masking layer blade having a pair of laterally opposite sidewalls separated by a first distance;
   etching said sacrificial material in alignment with said masking layer blade to form a sacrificial material blade having a pair of laterally opposite sidewalls;
   forming a structural layer on each side of said pair of laterally opposite sidewalls of said sacrificial material blade; and
   removing said sacrificial material blade to form a gap in said structural layer.

2. The method of forming a micromechanical structure (MEMS) according to claim 1, further comprising:
   after forming said masking layer blade, decreasing the first distance between said pair of laterally opposite sidewalls of said masking material blade from said first distance to a second distance.

3. The method of forming a micromechanical structure (MEMS) according to claim 1, further comprising:
   after forming said sacrificial material blade, exposing said sacrificial material blade to an etchant to decrease the width of said sacrificial material blade.

4. The method of forming a micromechanical structure (MEMS) as recited in claim 1, wherein said first distance is less than or equal to 50 nanometers.

5. The method of forming a micromechanical structure (MEMS) according to claim 1, wherein said masking material blade is defined by photolithography.

6. The method of forming a micromechanical structure (MEMS) according to claim 1:
   wherein said sacrificial material comprises germanium; and
   wherein said structural layer comprises silicon germanium.

7. The method of forming a micromechanical structure (MEMS) according to claim 1, wherein said sacrificial material blade has an aspect ratio (height:width) of greater than 4:1.

8. A method of forming a micromechanical structure (MEMS), comprising:
   forming a blade of sacrificial material over a substrate, said blade having have a top surface and a pair of laterally opposite sidewalls;
   depositing a structural layer over said blade and adjacent to said laterally opposite sidewalls of said blade;
   removing said structural layer from the top surface of said blade to expose said blade; and
   removing said blade of sacrificial material to form a gap in said structural layer.

9. The method of forming a micromechanical structure (MEMS) according to claim 8, wherein said structural layer is removed from the top surface of said blade by chemical mechanical polishing.

10. The method of forming a micromechanical structure (MEMS) according to claim 8, wherein said blade as an aspect ratio (height:width) of greater than 4:1.

11. The method of forming a micromechanical structure (MEMS) according to claim 8:
    wherein said sacrificial material comprises polycrystalline germanium; and
    wherein said structural layer comprises polycrystalline silicon germanium.

12. A method of forming a micromechanical system, comprising:
    forming a sacrificial material of a first semiconductor material on a substrate;
    forming a first trench and a second trench in said sacrificial material, wherein said first trench is separated from said second trench by a portion of said sacrificial material;
    depositing a structural film comprising a second semiconductor material into said first trench and into said second trench and over said portion of said sacrificial material;
    removing said structural film to expose said portion of said sacrificial material;
    removing said sacrificial material to form a first member and a second member from said structural film in said first trench and said second trench, respectively;
    wherein said first member is separated from said second member by a gap formed by removing said portion of said sacrificial material.

13. The method of forming a micromechanical system according to claim 12:
    wherein said first semiconductor material comprises polycrystalline germanium; and
    wherein said second semiconductor material comprises polycrystalline silicon germanium.

14. The method of forming a micromechanical system according to claim 12, wherein said portion of said sacrificial material has width of 50 nanometers or less.

15. The method of forming a micromechanical system according to claim 12, wherein said portion of said sacrificial material is a blade.

16. The method of forming a micromechanical system according to claim 12, wherein said removing said structural film to expose said portion of said sacrificial material comprises planarizing.

17. The method of forming a micromechanical system according to claim 16, wherein said planarizing comprises polishing.

18. The method of forming a micromechanical system according to claim 12, wherein said blade has an aspect ratio (height:width) of at least 4:1.

19. The method of forming a micromechanical system according to claim 12:
    wherein said first member comprises a resonator; and
    wherein said second member is selected from the group consisting of a sense electrode and a drive electrode.

20. A method of forming micromechanical system, comprising:
- depositing a sacrificial material chemical vapor deposition on a substrate;
- forming a first trench and a second trench in said sacrificial material, wherein said first trench is separated from said second trench by a portion of said sacrificial material;
- blanket depositing a structural film by chemical vapor deposition into said first trench and into said second trench and over said portion of said sacrificial material;
- removing said structural film to expose said portion of said sacrificial material; and
- removing said portion of said sacrificial material to form a first member and a second member from said structural film in said first trench and said second trench, respectively, wherein said first member is separated from said second member by a gap formed by removing said portion of said sacrificial material.

21. The method of forming a micromechanical system according to claim 20, wherein said sacrificial material is polycrystalline germanium and said structural film is polycrystalline silicon germanium.

22. The method of forming a micromechanical system according to claim 20, wherein said portion of said sacrificial material has width of 50 nanometers or less.

23. The method of forming a micromechanical system according to claim 20, wherein said portion of said sacrificial material is a blade.

24. The method of forming a micromechanical system according to claim 20, wherein said blade has an aspect ratio (height:width) of at least 4:1.

25. The method of forming a micromechanical system according to claim 20:
- wherein said first member comprises a resonator; and
- wherein said second member is selected from the group consisting of a sense electrode and a drive electrode.

26. The method of forming a micromechanical system according to claim 20, wherein said removing said structural film to expose said portion of said sacrificial material comprises planarizing.

27. The method of forming a micromechanical system according to claim 26, wherein said planarizing comprises polishing.

* * * * *